United States Patent [19]

Pigott

[11] Patent Number: 4,760,286
[45] Date of Patent: Jul. 26, 1988

[54] COMPARATOR WITH INPUT OFFSET CURRENT ELIMINATION

[75] Inventor: John M. Pigott, Tempe, Ariz.

[73] Assignee: Motorola, Inc., Schaumburg, Ill.

[21] Appl. No.: 75,788

[22] Filed: Jul. 20, 1987

[51] Int. Cl.$^4$ .......................... H03K 5/24; H03K 5/153
[52] U.S. Cl. ..................... 307/350; 307/355;
307/358; 307/491; 307/494; 330/257; 330/261
[58] Field of Search ............... 307/350, 355, 356, 362,
307/358, 491; 330/252, 257, 261; 307/494

[56] References Cited

U.S. PATENT DOCUMENTS

| | | | |
|---|---|---|---|
| 4,429,284 | 1/1984 | Wheatley, Jr. | 330/257 |
| 4,446,385 | 5/1984 | Orengo et al. | 307/355 |
| 4,506,170 | 3/1985 | Mizuide | 307/355 |
| 4,680,483 | 7/1987 | Giordano | 307/355 |

*Primary Examiner*—John Zazworsky
*Attorney, Agent, or Firm*—Vincent B. Ingrassia

[57] ABSTRACT

A comparator circuit for use with other comparator circuits on a common resistive divider chain includes PNP input transistors operating in conjunction with a current mirror circuit, and input circuitry coupled between the divider chain and the PNP transistors for rendering the input bias currents to the PNP transistors equal when the comparator is in an unbalanced state. This circuitry is coupled to different potentials on the divider chain, and a current is derived from each of these potentials. These currents are essentially equal because they are each derived from the sum of half of the emitter currents of each input PNP transistor in the comparator. So, although the PNP transistor will have unequal currents when the inputs are not balanced, the input circuitry will balance these currents at all times.

7 Claims, 1 Drawing Sheet

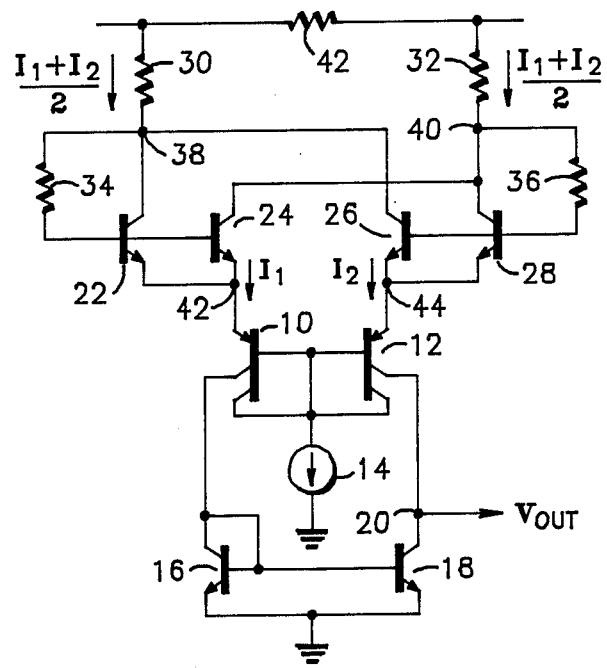

COMPARATOR WITH INPUT OFFSET CURRENT ELIMINATION

BACKGROUND OF THE INVENTION

This invention relates generally to an improved comparator circuit and, more particularly, to improved comparator circuits suitable for use when the input voltage to be compared may be greater than the comparator circuit's supply voltage. More particularly, the invention relates to an improved comparator circuit suitable for use in conjunction with other comparators on a common resistive divider chain.

The most typical comparator circuits are of the type which comprise input NPN transistors, the base electrodes of which may be coupled to the input terminals of the comparator. In this case, the input bias currents (i.e. the base currents of the input NPN transistors) are small. Unfortunately, such comparator circuits have application only when the input voltages to be compared are less than the circuit supply voltage.

In automotive applications, however, it is necessary that a comparator circuit be capable of comparing voltages higher than the supply voltage. Furthermore, it is desirous that several such comparator circuits be coupled to a common resistive divider chain for comparing different voltages on the chain. Due to the relatively high input voltages (compared to the supply voltage), NPN transistors are not suitable as input transistors, and PNP transistors are employed. PNP transistors, however, draw relatively large input bias currents (e.g. 10–20 micro amperes) thus affecting the resistor ratio of the divider chain and reducing the accuracy of the comparators.

SUMMARY OF THE INVENTION

It is an object of the present invention to provide an improved comparator circuit.

It is a still further object of the present invention to provide an improved comparator circuit for use in applications wherein the input voltages to be compared are high with respect to the supply voltage.

It is a still further object of the present invention to provide an improved comparator circuit for automotive applications wherein several such comparator circuits are used in conjunction with a common resistive divider chain.

Yet another object of the present invention is to provide an improved comparator circuit for use in conjunction with other comparators on a common resistive divider chain wherein each comparator includes means for eliminating input offset currents According to a broad aspect of the invention there is provided a comparator circuit, comprising comparing means having first and second inputs and having an output, and first means coupled to the first and second inputs and to a source of first and second potentials for rendering the currents flowing into the first and second input substantially equal.

BRIEF DESCRIPTION OF THE DRAWINGS

The above and other objects, features and advantages of the present invention will be more clearly understood from the following detailed description taken in conjunction with the accompanying drawing which is a schematic diagram of the inventive comparator circuit.

DESCRIPTION OF THE PREFERRED EMBODIMENT

Referring to the drawing, the comparing portion of the inventive comparator circuit comprises first, second dual collector PNP transistors 10 and 12, current source 14 and first and second NPN transistors 16 and 18 coupled in current mirror forming relationship with each other and with input PNP transistors 10 and 12. That is, the base electrodes of transistors 16 and 18 are coupled together, and their collector electrodes are coupled respectively to first collectors of PNP transistors 10 and 12. The base electrodes of transistors 10 and 12 are coupled together and to a first source of supply voltage (e.g. ground) via current source 14. The second collectors of transistors 10 and 12 are coupled together and to the base electrodes for regulating the current flowing in the emitters of transistors 10 and 12. NPN transistor 16 is diode coupled; i.e. its collector is coupled to its base, and the emitters of transistors 16 and 18 are coupled to the first source of supply voltage.

The comparing portion of the circuit operates in the well known manner. That is, if the current flowing in the emitter of transistor 10 exceeds that flowing in the emitter of transistor 12, the current flowing in the collector of transistor 10 will exceed that flowing in the collector of transistor 12. Due to the current mirror action of transistors 16 and 18, transistor 18 will attempt to pull current into its collector equal to that flowing in the collector of transistor 10 thus causing the voltage at node 20 to fall. Similarly, if the current flowing in the emitter of transistor 12 exceeds that flowing in the emitter of transistor 10, the current flowing in the first collector of transistor 12 will exceed that flowing in the first collector of transistor 10. Transistor 18 will attempt to draw at its collector a current equal to that flowing in the collector of transistor 10; i.e. a current less than the current flowing in the first collector of transistor 12. This will cause the voltage at node 20 to rise.

In order to prevent interaction between comparators of the type shown in a drawing when coupled to a common resistive divider chain, additional circuitry is provided to assure that the input bias currents drawn by the emitters of PNP transistors 10 and 12 are equal when the comparator is in an unbalanced state. This additional circuitry comprises NPN transistors 22, 24, 26, and 28 and resistors 30, 32, 34, and 36.

A sense resistor 42 represents a resistor in the common resistive divider chain. As can be seen, first ends of resistors 30 and 32 are coupled to opposite sides of sense resistor 42. The second ends of resistors 30 and 32 are coupled respectively to nodes 38 and 40. Node 38 is in turn coupled to the collectors of transistors 22 and 26, and node 40 is coupled to the collectors of transistors 24 and 28. In order to limit the base current flowing into transistors 22 and 28, resistors 34 and 36 respectively are coupled between the base and collector terminals of transistors 22 and 28 respectively. Finally, the emitters of transistors 22 and 24 are coupled to the emitter of PNP transistor 10, and the emitters of transistors 26 and 28 are coupled to the emitter of PNP transistor 12.

As stated previously, the purpose of this additional circuitry is to equalize the input bias currents when the comparator is in an unbalanced condition. This is accomplished as follows. If it is assumed that the current flowing in the emitter of PNP transistor 10 is $I_1$, then the current flowing in the collectors of NPN transistors 22 and 24 are each approximately equal to $I_1/2$ (ignoring base currents which are very small). Similarly, the currents flowing in the collectors of transistors 26 and 28 are approximately equal to $I_2/2$. The currents flowing in transistors 22 and 26 are summed at node 38. Thus the current flowing into node 38 from one side of resistor 42 is approximately equal to $(I_1+I_2)/2$. Likewise, the currents flowing in NPN transistors 24 and 28 are summed at node 40 and the current flowing into node 40 from the other side of resistor 42 is approximately equal to $(I_1+I_2)/2$.

Thus, the currents flowing from each end of resistor 42 have been balanced and, as a result, there will be no deleterious interaction between comparators on a common resistive divider chain.

The above description is given by way of example only. Changes in form and details may be made by one skilled in the art without departing from the scope of the invention as defined by the appended claims.

I claim:

1. A comparator circuit, comprising:
   comparing means having first and second inputs and having an output; and
   first means coupled to said first and second inputs and to a source of first and second potentials for rendering the currents flowing into said first and second inputs substantially equal, said first means comprising:
   second means for providing a first current from said first potential;
   third means for providing a second current from said second potential;
   a first NPN transistor having a collector coupled to said second means, a base coupled to its collector, and an emitter coupled to said first input;
   a second NPN transistor having a collector coupled to said third means, and emitter coupled to said second input and having a base coupled to its collector;
   a third NPN transistor having a collector coupled to said third means, an emitter coupled to said first input and a base coupled to the base of said first NPN transistor; and
   a fourth NPN transistor having a collector coupled to said second means, an emitter coupled to said second input, and a base coupled to the base of said second NPN transistor.

2. A circuit according to claim 1 wherein each of said second and third means comprises a resistor.

3. A circuit according to claim 2 further comprising:
   a first base current limiting resistor coupled between the base of said first NPN transistor and collector of said first NPN transistor; and
   a second base current limiting resistor coupled between the base of said second NPN transistor and the collector of said second NPN transistor.

4. A circuit according to claim 2 wherein said comparing means comprises:
   first and second PNP transistors each having a base, emitter and collector terminals, the emitter terminals of said first and second PNP transistors forming respectively said first and second inputs, the base terminals of said first and second PNP transistors coupled together; and
   current mirror means coupled between first collector terminals of said first and second PNP transistors.

5. A circuit according to claim 4 wherein each of said first and second PNP transistors comprises a second collector terminal coupled together and to the base electrodes of said first and second PNP transistors.

6. A circuit according to claim 5 further comprising a current source for coupling between a source of supply voltage and the base electrodes and second collector terminals of said first and second PNP transistors.

7. A circuit according to claim 5 wherein said current mirror means comprises fifth and sixth NPN transistors each having a base coupled together and an emitter for coupling to a source of supply voltage, the collector of said fifth NPN transistor coupled to its base and to the first collector terminal of said first PNP transistor, and the collector of said sixth NPN transistor coupled to the first collector terminal of said second PNP transistor and to said output.

* * * * *

UNITED STATES PATENT AND TRADEMARK OFFICE
CERTIFICATE OF CORRECTION

PATENT NO. : 4,760,286
DATED     : July 26, 1988
INVENTOR(S) : John M. Pigott

It is certified that error appears in the above-identified patent and that said Letters Patent is hereby corrected as shown below:

Column 4, claim 3, line 09, delete "2" insert --1--.

Column 4, claim 4, line 16, delete "2" insert --1--.

Signed and Sealed this

Nineteenth Day of December, 1989

Attest:

JEFFREY M. SAMUELS

*Attesting Officer*     *Acting Commissioner of Patents and Trademarks*